US012740368B2

(12) United States Patent
Fulford et al.

(10) Patent No.: US 12,740,368 B2
(45) Date of Patent: Sep. 15, 2026

(54) WAFER SUPPORT FOR MEASURING WAFER GEOMETRY

(71) Applicant: Tokyo Electron Limited, Tokyo (JP)

(72) Inventors: Daniel Fulford, Albany, NY (US); Mark I. Gardner, Austin, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 323 days.

(21) Appl. No.: 18/511,557

(22) Filed: Nov. 16, 2023

(65) Prior Publication Data

US 2025/0167024 A1 May 22, 2025

(51) Int. Cl.
*G01B 21/20* (2006.01)
*H10P 72/00* (2026.01)
*H10P 74/20* (2026.01)

(52) U.S. Cl.
CPC .......... *H10P 72/0616* (2026.01); *G01B 21/20* (2013.01); *H10P 74/203* (2026.01)

(58) Field of Classification Search
CPC ...................................................... G01B 21/20
USPC .......................................... 33/551, 552, 553
See application file for complete search history.

(56) References Cited

U.S. PATENT DOCUMENTS 4,390,172 A * 6/1983 Gotman ............... F16M 11/041 29/559
8,225,683 B2 * 7/2012 Bailey, III ............ G01B 21/30 73/104
9,689,804 B2 6/2017 Bobrov
11,885,750 B2 1/2024 Arora et al.
12,072,176 B2 * 8/2024 Zeng .................. G01B 11/2441
12,399,134 B2 * 8/2025 Han ................... G01N 21/9501
2011/0283940 A1 * 11/2011 Jhong ................ H10P 72/7612 118/668
2022/0074869 A1 * 3/2022 Arora ................ G01N 21/9505
2025/0029853 A1 * 1/2025 Cillie ........................ G01J 5/48
2025/0132180 A1 * 4/2025 Kang .................. G01B 11/254
2025/0218831 A1 * 7/2025 Naribole ............. H10P 72/0616

FOREIGN PATENT DOCUMENTS

CN 105066897 A 11/2015
JP 2008-177206 A 7/2008
KR 10-2021-0053372 A 5/2021

OTHER PUBLICATIONS

International Search Report and Written Opinion issued Feb. 25, 2025 in PCT/US2024/054990 citing document Nos. 1-2 and 15-17 therein, 10 pgs.

* cited by examiner

*Primary Examiner* — George B Bennett
(74) *Attorney, Agent, or Firm* — Oblon, McClelland, Maier & Neustadt, L.L.P.

(57) ABSTRACT

A wafer measurement stage for supporting a semiconductor wafer for surface geometry measurements. The wafer measurement stage includes a support body having a planar surface configured to face a wafer which is supported by the wafer measurement stage, and a wafer contact structure provided on the planar surface. The wafer contact structure is configured to contact a portion of a wafer such that the wafer is supported in an elevated position relative to the planar surface and to control gravity effects at non-contact portions of the wafer.

18 Claims, 7 Drawing Sheets

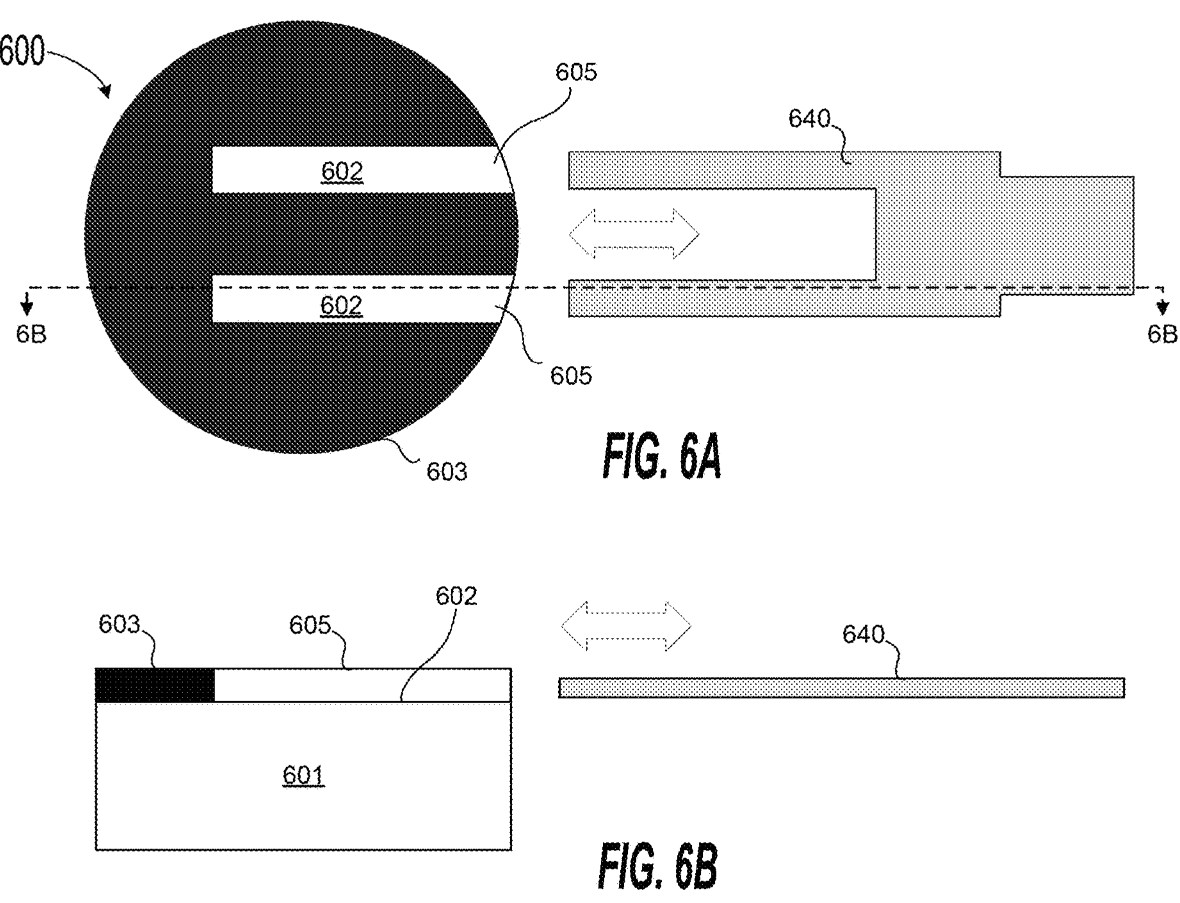
FIG. 6A
603 605 602 640
601
FIG. 6B
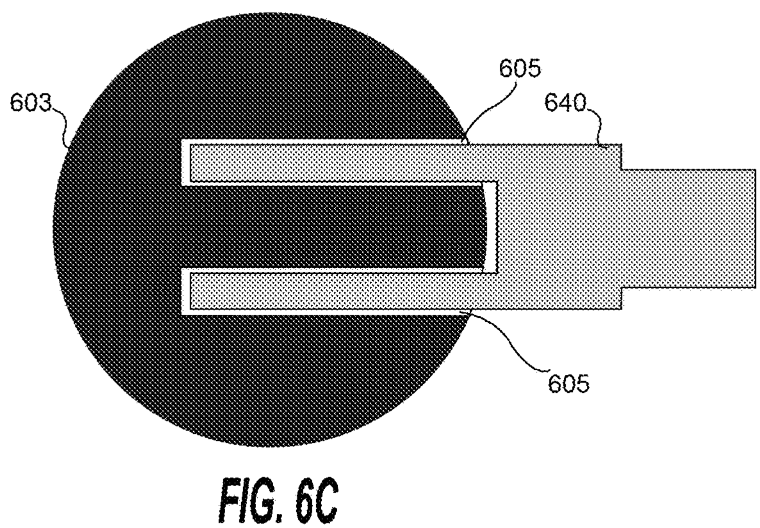
FIG. 6C

WAFER SUPPORT FOR MEASURING WAFER GEOMETRY

FIELD OF THE INVENTION

The present disclosure relates to semiconductor fabrication, and, more particularly, to a wafer support for use in measuring wafer geometry such as bow and/or warp.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor fabrication involves multiple varied steps and processes. One typical fabrication process is known as photolithography (also called microlithography). Photolithography uses radiation, such as ultraviolet or visible light, to generate fine patterns in a semiconductor device design. Many types of semiconductor devices, such as diodes, transistors, and integrated circuits, can be constructed using semiconductor fabrication techniques including photolithography, etching, film deposition, surface cleaning, metallization, and so forth.

Exposure systems are used to implement photolithographic techniques. An exposure system typically includes an illumination system, a reticle (also called a photomask) or spatial light modulator (SLM) for creating a circuit pattern, a projection system, and a wafer alignment stage for aligning a photosensitive resist-covered semiconductor wafer. The illumination system illuminates a region of the reticle or SLM with a (preferably) rectangular slot illumination field. The projection system projects an image of the illuminated region of the reticle pattern onto the wafer. For accurate projection, it is important to expose a pattern of light on a wafer that is relatively flat or planar, preferably having less than 10 microns of height deviation.

SUMMARY

Note that this summary section does not specify every embodiment and/or incrementally novel aspect of the present disclosure. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

An aspect (1) of the present disclosure provides a wafer measurement stage for supporting a semiconductor wafer for surface geometry measurements. The wafer measurement stage includes a support body having a planar surface configured to face a wafer which is supported by the wafer measurement stage, and a wafer contact structure provided on the planar surface. The wafer contact structure is configured to contact a portion of a wafer such that the wafer is supported in an elevated position relative to the planar surface and control gravity effects at non-contact portions of the wafer.

An aspect (2) includes the wafer measurement stage of aspect (1), wherein the planar surface of the support body has a smaller area than a wafer to be supported on the wafer measurement stage.

An aspect (3) includes the wafer measurement stage of aspect (1), wherein the contact structure includes a plurality of the ring contact structures provided in concentric arrangement on the planar surface.

An aspect (4) includes the wafer measurement stage of aspect (1), wherein the wafer contact structure includes a plurality of lines of support material provided on the planar surface.

An aspect (5) includes the wafer measurement stage of aspect (4), wherein the plurality of lines of support material do not intersect one another.

An aspect (6) includes the wafer measurement stage of aspect (4), wherein the plurality of lines of support material include a plurality of parallel lines of support material.

An aspect (7) includes the wafer measurement stage of aspect (5), wherein the plurality of lines of support material intersect one another.

An aspect (8) includes the wafer measurement stage of aspect (5), wherein the plurality of lines of support material include a grid of support material.

An aspect (9) includes the wafer measurement stage of aspect 1, wherein a cross section of the line of support material has a substantially circular shape.

An aspect (10) includes the wafer measurement stage of aspect 1, wherein a cross section of the line of support material has a substantially rectangular shape having a top support surface and opposing sidewalls which extend from the top support surface to the planar surface of the support body.

An aspect (11) includes the wafer measurement stage of aspect 1, wherein the wafer contact structure includes a field of support material covering the planar surface.

Another aspect (12) includes an apparatus for measuring geometry of a wafer which includes a wafer measurement stage for supporting a semiconductor wafer. The wafer measurement stage includes a support body having a planar surface configured to face a wafer which is supported by the wafer measurement stage, and a wafer contact structure provided on the planar surface. The wafer contact structure is configured to contact a portion of a wafer such that the wafer is supported in an elevated position relative to the planar surface and wafer sag is permitted at non-contact areas of the wafer. A metrology tool is. configured to measure geometry of a wafer resting on the wafer measurement stage.

An aspect (13) includes the apparatus of aspect (12), wherein the metrology tool is configured to measure wafer geometry using at least one of optical, acoustic, and capacitive mechanisms to measure the z-height deviations across a surface of the wafer.

An aspect (14) includes the apparatus of aspect (12), further including a processing unit including a processor and a memory for storing software which, when executed by the processor, mathematically removes at least a portion of gravity effects from a measured geometry of a wafer resting on the wafer measurement stage.

An aspect (15) includes the apparatus of aspect (14), wherein the memory stores data correlated to gravity effects on the non-contact portions of the wafer for use in mathematically removing the gravity effects on the non-contact portions of the wafer resting on the wafer measurement stage.

Another aspect (16) of the disclosure includes a method of measuring wafer geometry which includes providing a wafer on a measurement stage. The measurement stage includes a support body having a planar surface configured to face a wafer which is supported by the wafer measurement stage, and a wafer contact structure provided on the planar surface. The wafer contact structure is configured to contact a portion of a wafer such that the wafer is supported in an elevated position relative to the planar surface and to control gravity effects at non-contact portions of the wafer. A geometry of the wafer resting on the wafer measurement stage is measured.

An aspect (17) includes the method of claim (16), further including mathematically removing gravity effects from a geometry measurement obtained from said measuring a geometry.

An aspect (18) includes the method of claim (17), wherein said mathematically removing includes removing gravity effects on said non-contact portions of the wafer resting on the wafer measurement stage.

BRIEF DESCRIPTION OF THE DRAWINGS

Various embodiments of this disclosure that are proposed as examples will be described in detail with reference to the following figures, wherein like numerals reference like elements, and wherein:

FIGS. 6A, 6B and 6C show schematic illustrations of a wafer measurement stage for accepting a wafer transfer arm without using wafer lift pins in accordance with an example embodiment of the present disclosure;

DETAILED DESCRIPTION

Figures 1A, 1B, 1C:
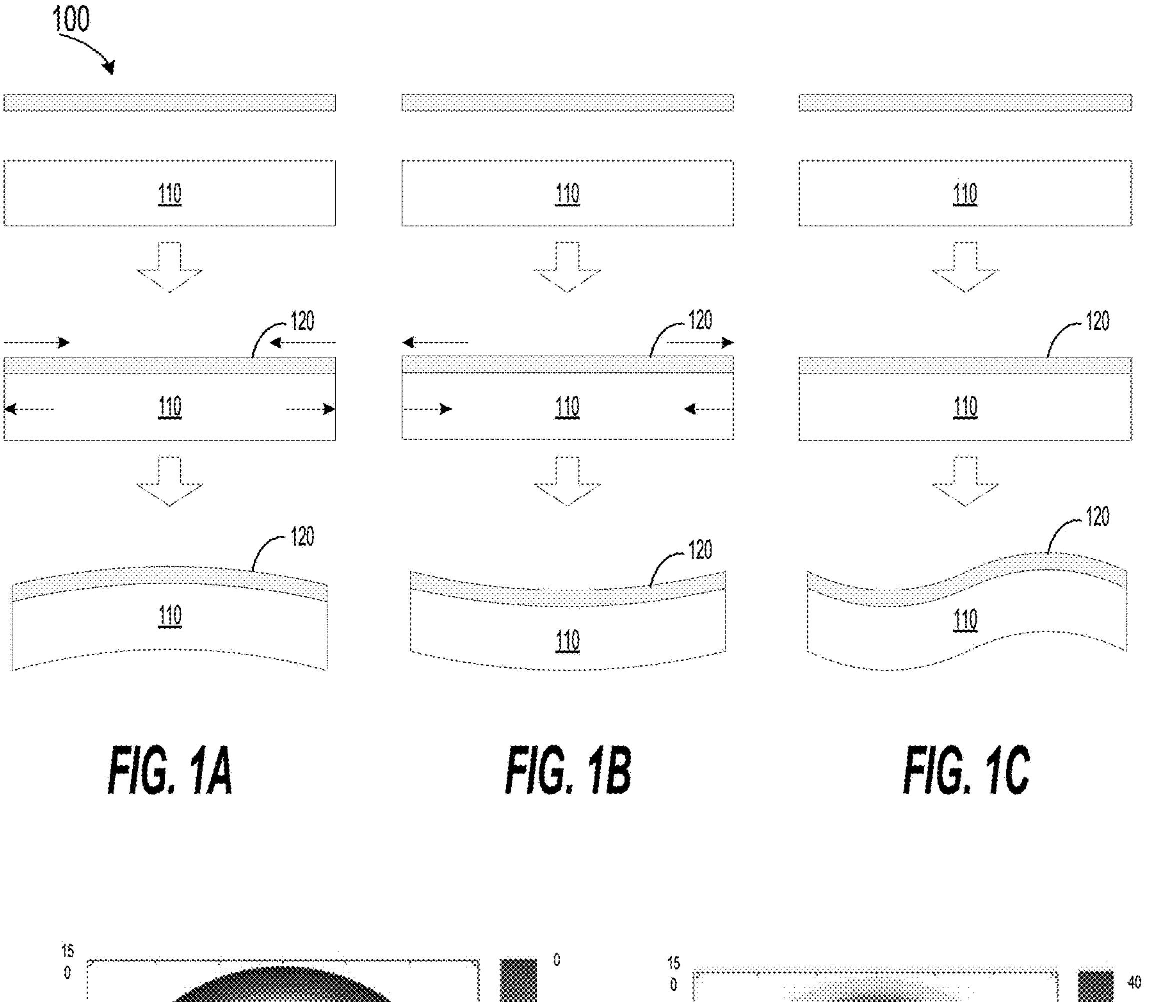
FIGS. 1A to 1C show first and second order bowing of a wafer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

A functional semiconductor wafer can include the integration of 70+ individual layers that ultimately culminate in functional devices. Each level requires multiple processing steps including, but not limited to thin film deposition, lithography and etches to form the desired structures. For example, microfabrication of a semiconductor structure 100 begins with a flat substrate or wafer 110, as those illustrated in FIGS. 1A to 1C. During microfabrication of the semiconductor structure 100, multiple processing steps are executed that can include depositing material on the wafer 110, removing material, implanting dopants, annealing, baking, and so forth. Different materials and structural formations 120 thus formed can induce non-uniform wafer stresses, which result in bowing of the semiconductor structure 100, which in turn affects overlay and typically results in overlay errors of various magnitudes.

Figures 2A, 2B:
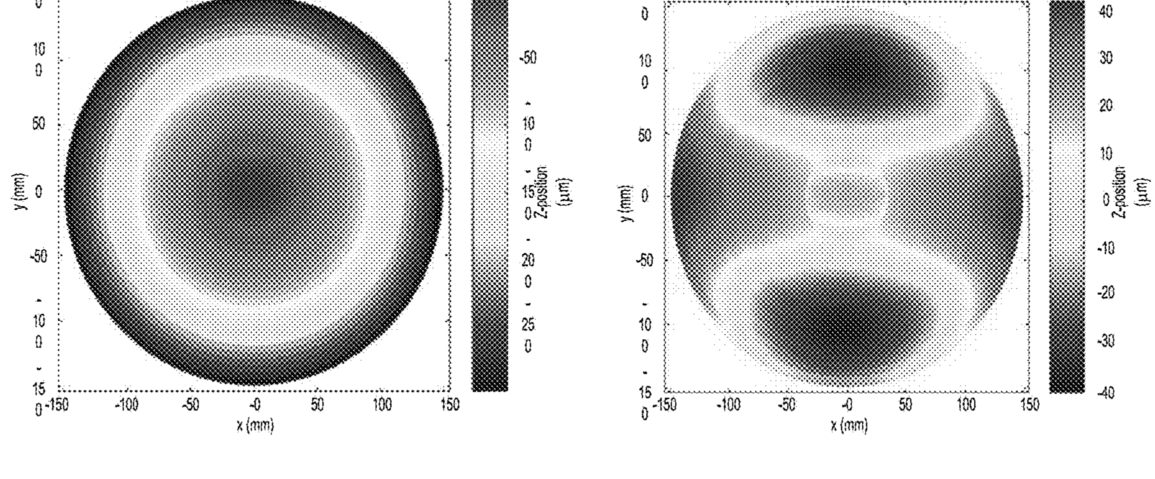
FIGS. 2A and 2B show low order global wafer distortion and high order local wafer distortion, respectively.

For example, FIGS. 1A and 1B show how the different materials and structural formations 120 can either induce a compressive or tensile stress in the wafer 110, respectively, resulting in first order bowing with bow measurements illustrating z-direction height (or z-height) deviations from a reference plane (not shown). As another example, FIG. 1C shows second order bowing of the wafer 110 with two bow measurements identifying positive and negative z-height deviations, respectively. The non-uniform wafer stresses fundamentally distort the wafer grid. These distortions can manifest as low order global spherical type deformations as depicted in FIG. 2A, which shows z-height variations on 300 nm semiconductor wafers. Higher order localized z-height variations may exist as stand-alone distortions or may be embedded in the global signature. An example of a higher order wafer deformation is presented in FIG. 2B.

The data presented is derived from standard semiconductor metrology equipment common to the industry. Laser interferometry is a technique that can be used to measure the warp or bow of a wafer. The basic principle behind this technique is that it measures the changes in the wavelength of light that is reflected off the surface of the wafer. In laser interferometry, a laser beam is split into two separate beams using a beam splitter. One beam is directed at the wafer while the other beam is directed at a reference mirror. Both beams are then reflected back to the beam splitter, where they recombine. When the two beams recombine, they create an interference pattern, which can be detected using a photodetector. This interference pattern will be affected by the warping of the wafer. Specifically, if the wafer is warped, then the reflected light waves will have traveled slightly different distances, resulting in a shift in the interference pattern. By analyzing the interference pattern, laser interferometry can measure the degree of warping in the wafer.

One issue with existing wafer chucks is that they can alter the bow of the wafer they hold, either through the suction force used to secure the wafer or the gravitational force acting on the wafer while it is on the chuck. For example, a wafer having unacceptable stresses therein may present as having an acceptable flatness when resting on the substrate holder. Techniques herein provide a wafer measurement stage which minimizes the alteration of wafer geometry by gravity effects and/or provides a wafer support structure to enable mathematical removal of gravity effects on the wafer to improve the accuracy of wafer geometry measurements.

Figure 3A:
FIG. 3A is a schematic illustration of a wafer measurement stage in accordance with an example embodiment of the present disclosure.
Figure 3A:
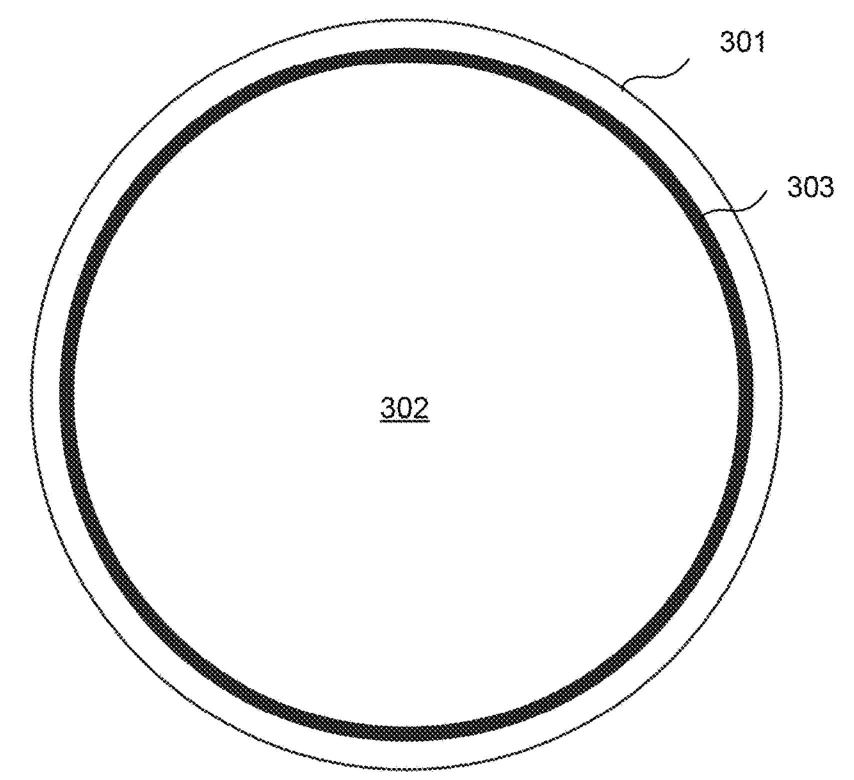

FIG. 3A is a top plan view of a wafer measurement stage in accordance with an example embodiment of the present disclosure. As shown, the wafer measurement stage 300 includes a support body 301 having a top planar surface 302 which is configured to face the underside of a wafer supported by the wafer measurement stage. A wafer contact structure 303 is provided on the planar surface 302 and is configured to contact a portion of a wafer 320. In the embodiment shown, the wafer contact structure 303 is a single ring shaped structure near the periphery of the support body 301.

Figure 3B:
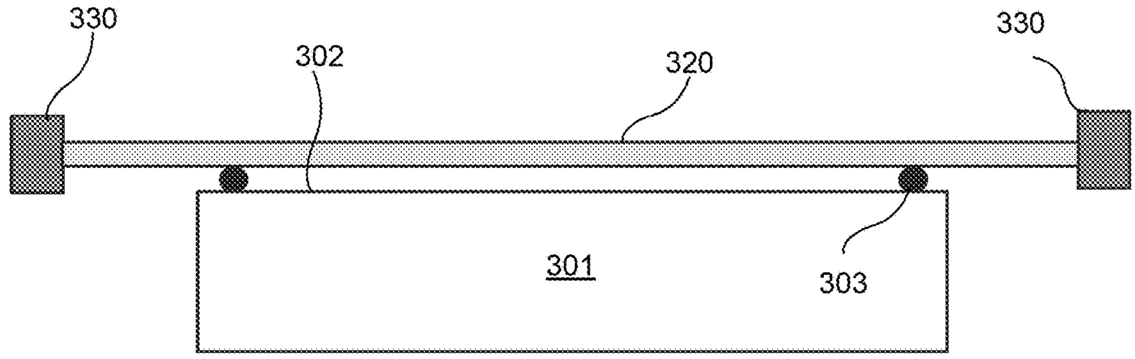
FIG. 3B shows the wafer measurement stage of FIG. 3A with a wafer supported thereon.

FIG. 3B shows an edge-type wafer clamp 330 placing a wafer 320 on the wafer measurement stage of FIG. 3A. In the embodiment of FIG. 3B, the planar surface 302 has a smaller area than the wafer 320 to facilitate use of the edge clamp 330 for placement of the wafer 320. Other types of wafer transfer devices may be used as will be discussed further below. As shown in FIG. 3B, the contact structure 303 has a circular cross section similar to a common o-ring. In some embodiments, the contact structure 303 may be formed separately from the support body 301 and joined with the support surface 3021 to form the wafer measurement stage 300. The support structure material may include Silicone, Polyurethane, Ethylene Propylene Diene Monomer (EPDM), Nitrile Rubber (NBR) or any other suitable material selected in consideration of the specific requirements of the application, such as the temperature range, chemical resistance, and pressure rating etc. For example, silicone is a synthetic elastomer that is often used to make O-rings because it is soft, flexible, and has good heat resistance and polyurethane can be made into a soft, rubber-like material that is often used for seals. Fluorosilicone is a synthetic rubber that has good resistance to fuels, oils, and chemicals, and is often used in applications where high-temperature resistance is needed. EPDM has good resistance to UV radiation, and NBR has good resistance to oils, fuels, and chemicals.

When a wafer 320 is supported on the measurement stage, the contact structure 303 makes contact with a contact portion of the back side of the wafer 320 such that the wafer is supported in an elevated position relative to the planar surface 302. Such elevation of the wafer using pre-defined contact portions provides controlled gravity effects in non-contact portions of the wafer. Gravity effects may include sag, bow, twist or any other physical deformation of the wafer caused by gravity force on any area of the wafer. In the example embodiment of FIG. 3B, the wafer contact structure is a single ring shape near the periphery of the support body 301, which will cause the wafer to sag primarily in the middle of the wafer. This controlled sag from edge to center can be mathematically removed to allow the calculation of the wafer bow with minimal gravity effects.

Gravity effects can be minimized or removed using known mathematical techniques. For example, using the Representative Wafer Inversion Method (RWIM), a specially selected wafer is measured, and this measurement is considered the reference gravity effect, which is then removed from every other new measurement. Alternatively, using the Sample Wafer Inversion Method (SWIM), two measurements of each wafer are acquired: the first measurement with the front surface pointing upward and the second one pointing downward. The gravity effect is the mean value of these two measurements. A Theoretical Modeling Method (TMM) may also be used whereby the gravitational effect is derived from a theoretical model. This model is only available for an infinitely small center pin chuck, and the Stoney equation is used for silicon wafers. However, the TMM method may be unsuitable where there are large variations in the specifications of silicon wafers, for example, in thickness and wafer diameter, wafer deflection can range up to 20 μm, making this method useless for current and next-generation IC technology nodes.

The wafer support structure may be any predefined shape for controlling gravity effects on the wafer such that the gravity effects can be mathematically mitigated or removed from a wafer geometry measurement. For example, the wafer contact structure may include a line of support material which forms a closed shape structure on the planar surface such as the closed circle which forms a ring contact structure as shown in FIG. 3A. Other closed shapes such as a rectangle or irregular closed shapes may be used. Further, the wafer contact structure may include multiple closed shapes such as the concentric rings described above. The contact structure may also include a plurality of lines of support material provided on the planar surface but not forming a closed shape. Such lines of support material may or may not intersect one another. For example, the wafer support structure may include a plurality of parallel lines of support material, and may further include another plurality of parallel lines of support material that intersect the first plurality of parallel lines to form a grid of support material. The lines of support material may have a substantially circular cross-sectional shape as described above. Alternatively, a cross section of the line of support material may have a substantially rectangular shape having a top support surface and opposing sidewalls which extend from the top support surface to the planar surface of the support body. Such a rectangular shaped cross section may be provided by patterning the wafer support structure using photolithography.

Figure 4A:
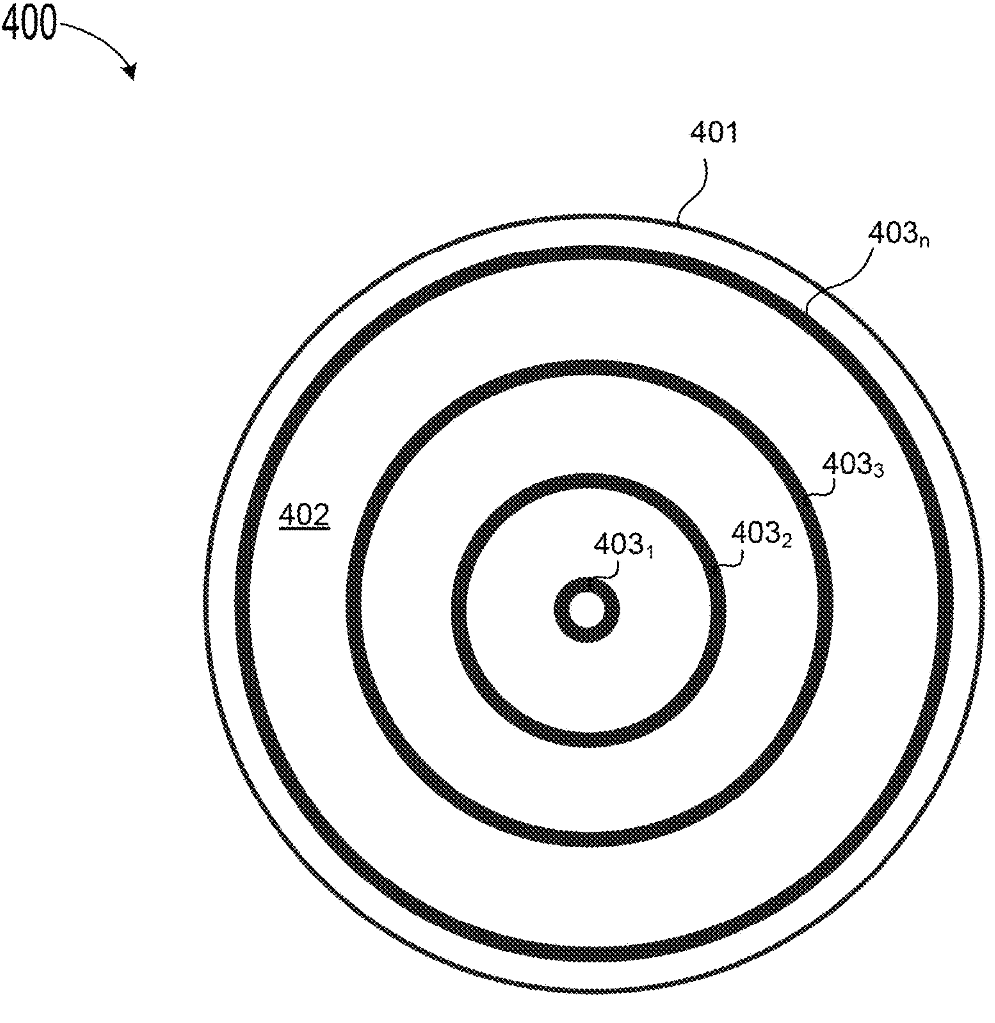
FIG. 4A is a schematic illustration of a wafer measurement stage in accordance with an example embodiment of the present disclosure.

FIG. 4A is a top plan view of a wafer measurement stage in accordance with an example embodiment of the present disclosure. As shown, the wafer measurement stage 400 includes a support body 401 having a top planar surface 402 which is configured to face the underside of a wafer supported by the wafer measurement stage. A wafer contact structure includes rings $\mathbf{403}_1$, $\mathbf{403}_2$, $\mathbf{403}_3$, $\mathbf{403}_n$, concentrically arranged on the planar surface 402 of the support body 401. This wafer contact structure is configured to contact predefined portions of the wafer 420.

Figure 4B:
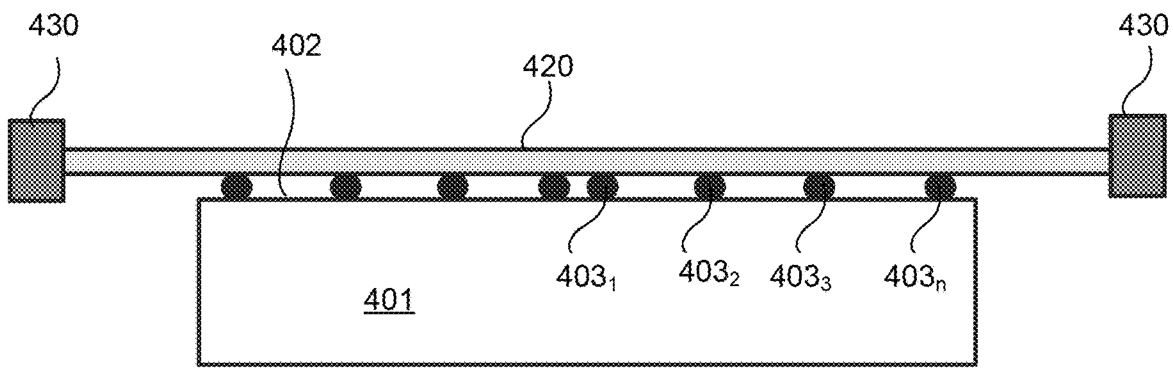
FIG. 4B shows the wafer measurement stage of FIG. 4A with a wafer supported thereon.

FIG. 4B shows an edge-type wafer clamp 430 placing a wafer 420 on the wafer measurement stage of FIG. 4A. As shown in FIG. 4B, each of the rings $\mathbf{403}_1$, $\mathbf{403}_2$, $\mathbf{403}_3$, $\mathbf{403}_n$, of the contact structure has a circular cross section, and these rings may be formed separately from the support body 401 and joined with the support surface 402 to form the wafer measurement stage 400. When a wafer 420 is supported on the measurement stage, the contact structure including rings $\mathbf{403}_1$, $\mathbf{403}_2$, $\mathbf{403}_3$, $\mathbf{403}_n$, makes contact with contact portions of the back side of the wafer 320 such that gravity effects are controlled to non-contact portions of the wafer and can be mathematically removed as noted above. The support structure material may include Silicone, Polyurethane, EPDM, NBR or any other suitable material selected in consideration of the specific requirements of the application as noted above.

Figure 5A:
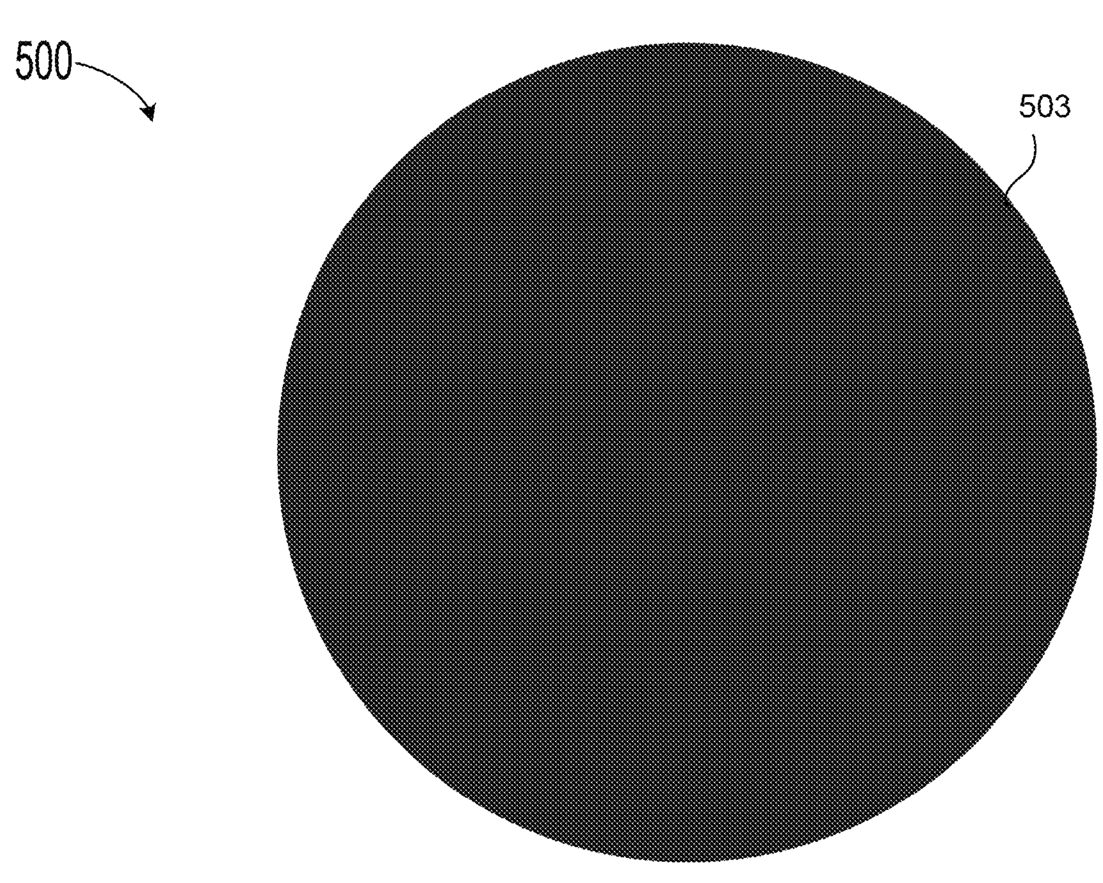
FIGS. 5A and 5B show a schematic illustration of a wafer measurement stage in accordance with an example embodiment of the present disclosure.
Figure 5B:
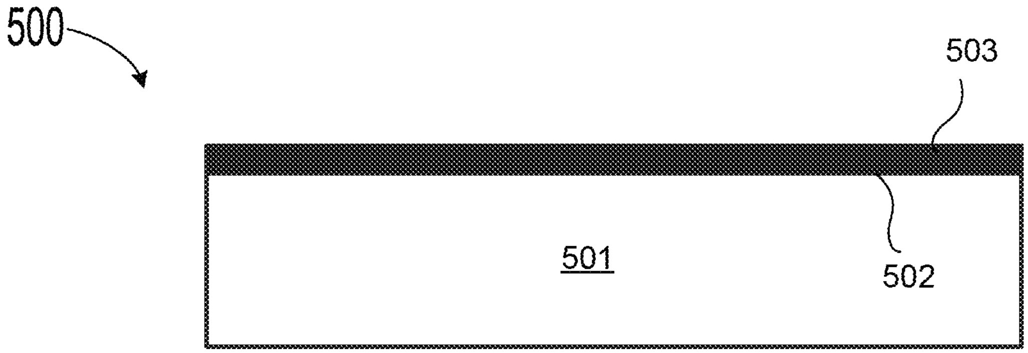

In another embodiment, the wafer contact structure may be formed of a soft and flexible material covering the entire planar surface of the measurement stage. FIG. 5A is a top plan view of a wafer measurement stage, and FIG. 5B is a side view thereof in accordance with an example embodiment of the present disclosure. As shown, the wafer measurement stage 500 includes layer a support body 501 having a top planar surface 502 which is configured to face the underside of a wafer supported by the wafer measurement stage. A wafer contact structure 503 covers the entire planar surface 502. The material of the wafer contact structure 503 has soft and flexible characteristics to take the shape of an object in order to minimize gravity effects on a wafer resting on the measurement stage 500. Silicone, Polyurethane, EPDM, NBR or any other suitable material may be used. In one embodiment, the material of the wafer contact structure 503 is a film of about 1000 μm thick to be able to absorb about 30 μm to 100 μm in height deviation due to wafer bow or warp, for example.

In some embodiments, portions of the coating of soft flexible material can be removed to form a support structure having a predefined shape. For example, photolithography techniques may be used to pattern the coating 503 and etch away portions of the coating. This technique permits retrofitting a conventional wafer measurement stage to mitigate gravity effects on a wafer supported by the stage.

FIGS. 6A, 6B and 6C show schematic illustrations of a wafer measurement stage for accepting a wafer transfer arm without using wafer lift pins in accordance with an example embodiment of the present disclosure. FIG. 6A is a top plan view of a wafer measurement stage 600 in relation to a wafer transfer arm, and FIG. 6B is a cross sectional view thereof. As shown, the wafer measurement stage 600 includes a support body 601 having a top planar surface 602 which is configured to face the underside of a wafer supported by the wafer measurement stage. A coating 603 of soft flexible material covers the surface 602 except for openings 605 suitable for receiving the forks of a wafer transfer arm 640. As noted above, areas for openings 605 may be formed by patterning the coating 603 using photolithography. FIG. 6C shows the wafer transfer arm 640 in a position to pick up or drop a wafer on the measurement stage 600. This permits use of the transfer arm 640 without the need for lift pins which can affect wafer bow.

Figure 7:
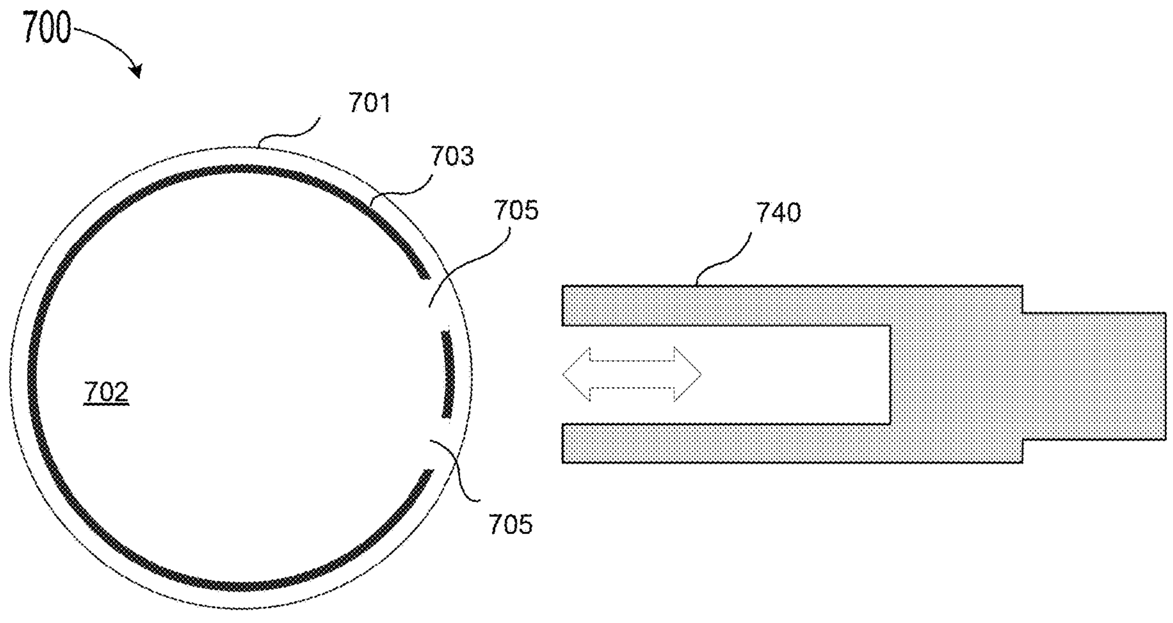
FIG. 7 is a schematic illustration of a wafer measurement stage for accepting a wafer transfer arm without using wafer lift pins in accordance with an example embodiment of the present disclosure.
Figure 8:
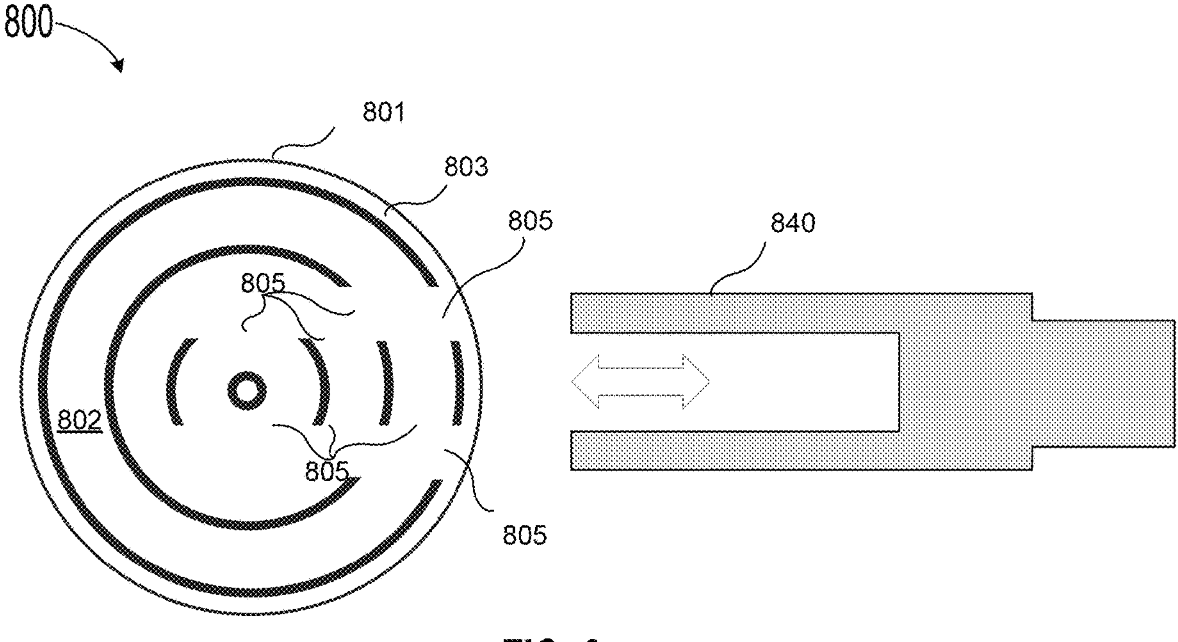
FIG. 8 is a schematic illustration of a wafer measurement stage for accepting a wafer transfer arm without using wafer lift pins in accordance with an example embodiment of the present disclosure.

The patterning technique may be used to form a support structure of any shape such as the single ring or concentric rings as discussed above. The support structure may also be further patterned to receive a wafer transfer arm. FIG. 7 is a top plan view of a wafer measurement stage in relation to a wafer transfer arm according to an example embodiment of the disclosure. As shown, the wafer measurement stage 700 includes a support body 701 having a top planar surface 702 with a contact structure 703 similar to that of FIG. 3A discussed above. The contact structure 703 is formed by patterning a coating of soft flexible material into a ring shape with openings 705 suitable for receiving the forks of a wafer transfer arm 740.

FIG. 7 is a top plan view of a wafer measurement stage in relation to a wafer transfer arm according to an example embodiment of the disclosure. As shown, the wafer measurement stage 800 includes a support body 801 having a top planar surface 802 with a contact structure 803 similar to that of FIG. 3A discussed above. The contact structure 703 is formed by patterning a coating of soft flexible material into concentric rings with openings 805 suitable for receiving the forks of a wafer transfer arm 840.

Figure 9:
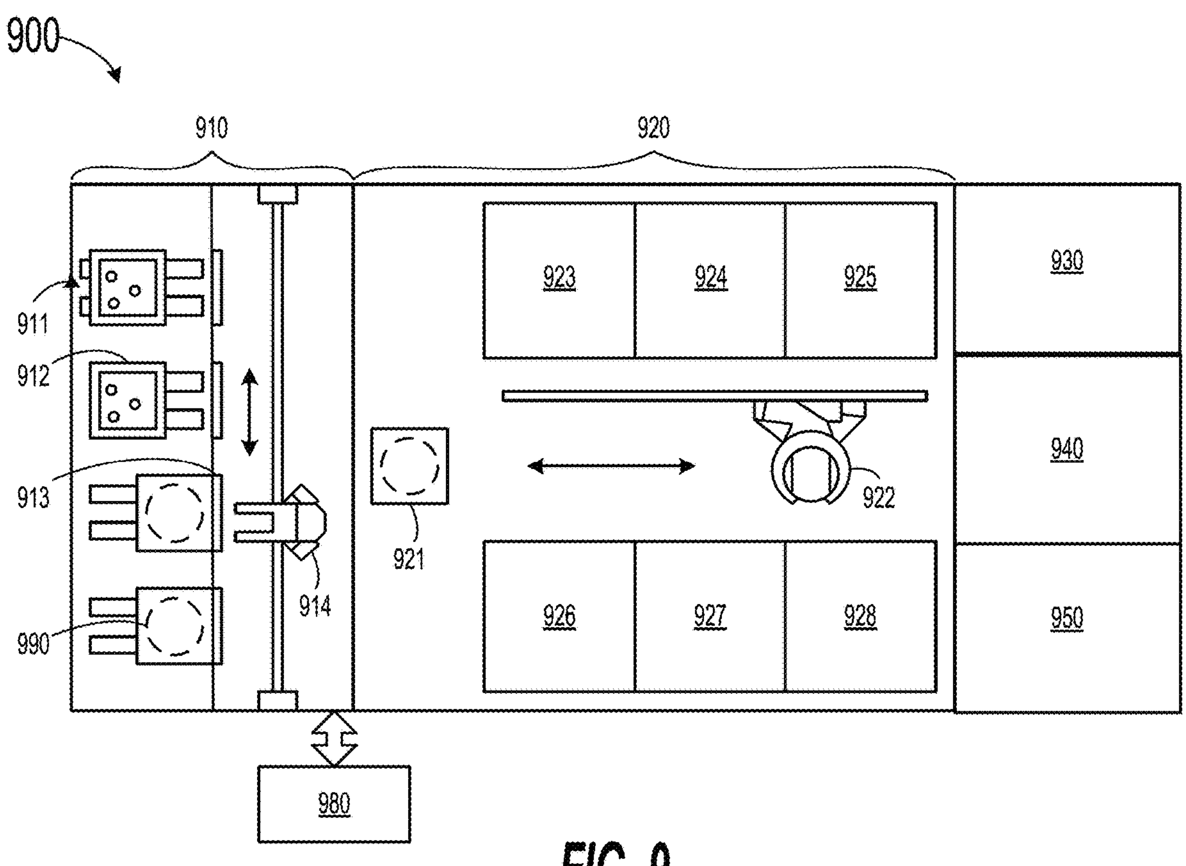
FIG. 9 is a plan view of an exemplary wafer processing system for correcting or modifying wafer bow in accordance with some embodiments of the present disclosure.

FIG. 9 is a plan view of an exemplary wafer processing system 900, e.g., a track lithography tool, for correcting or modifying wafer bow in accordance with some embodiments of the present disclosure. The wafer processing system 900 includes various wafer handling components or carriers, along with several stages, e.g., a carrier stage 910 and a treatment stage 920. The carrier stage 910 includes one or more pod assemblies 911 that are configured to receive one or more wafer cassettes 912 that are configured to contain one or more wafers 990, e.g., the wafer 110 shown in FIGS. 1A to IC, that are to be processed in the wafer processing system 900. Doors 913 can open to access the wafers 990 contained in the wafer cassettes 912. A carrier transfer robot 914 can move up and down and transfer the wafers 990 from the wafer cassettes 912 to a shelf unit 921 that is installed in the treatment stage 920 for storing the wafers 990 temporarily.

The treatment stage 920 includes a variety of treatment modules, e.g., treatment modules 923-928, and a treatment transfer robot 922. The treatment transfer robot 922 is configured to access the shelf unit 921 and the treatment modules 923-928 and transfer the wafers 990 among the treatment modules 923-928 for various processing. In an embodiment, the treatment transfer robot 922 can flip and rotate the wafers 990.

The modules 923-928 can include one or more metrology modules 923, which are configured to measure an amount of wafer bow of the wafers 990 and provide geometry measurements such as bow measurements to the wafer processing system 900. The metrology module includes a wafer measurement stage for mitigating gravity effects on a wafer resting thereon as disclosed herein. In an embodiment, the metrology modules 923 can use optical (e.g., using a scanning laser technique), acoustic and other mechanisms to measure the z-height deviations across a surface of the wafer and store the height deviations by (x, y) coordinates to identify a plurality of sub-bow measurements (x, y) of the bow measurement. Bow measurements can include measuring a degree of convexity or concavity, or mapping z-height deviation values on the wafers 990 relative to one or more reference z-height deviation values. In other words, z-height deviation values are spatially mapped, such as with coordinate locations, to identify z-height deviation values across a surface of the wafer 990. Bow measurements and z-height deviation values can be mapped at various resolutions depending on types of metrology equipment used and/or a resolution desired. In an embodiment, the metrology modules 923 can also measure the amount of die bow of each of dies obtained by dicing and singulating the wafer 990. In some embodiments, the metrology module 923 includes a processing unit including a processor and a memory for storing software which, when executed by the processor, mathematically removes at least a portion of gravity effects from a measured geometry of a wafer resting on the wafer measurement stage. The memory can store data correlated to gravity effects on non-contact portions of the wafer for use in mathematically removing such gravity effects. That is, in some embodiments, the mathematical process of removing gravity effects is based on predefined non-contact portions of the wafer due to a configuration of the support structure of the measurement stage.

In some examples, the treatment transfer robot 922 may first transfer a wafer 990 into the metrology module 923 with a working surface up to measure a bow on the working surface, then remove and flip the wafer and transfer a wafer 990 into the metrology module 923 with a backside surface up to measure a bow on the backside surface.

The bow measurements can include raw bow data or be represented as a bow signature with relative z-height deviation values. In many embodiments, the reference z-height deviation values may be all close to zero and thus representative of a wafer that is close to being flat. For example, a wafer that is close to being flat or considered flat for overlay improvement herein can be a wafer having an average z-height deviation value of less than 10 microns. In some embodiments, the reference z-height deviation values can represent some non-planar shape, but which shape is, notwithstanding, useful for overlay error correction—especially for particular stages of micro fabrication. Techniques herein enable correction of bowing that is greater than 10 microns, for example. The metrology module 923 is configured to measure the wafer 990, which has a working surface and a backside surface opposite to the working surface. The wafer 990 may have an initial wafer bow value resulting from one or more micro fabrication processing steps that have been executed to create at least part of a semiconductor device on the working surface of the wafer 990. For example, field-effect transistors (FETs) may be completed or only partially completed on the working surface of the wafer 990.

The treatment modules 923-928 can also include one or more film formation modules 924 that are configured to form one or more films, e.g., a shape control layer, on a surface of the wafer 990 being processed. The film formation module 924 can be configured to deposit a shape control layer on the frontside and/or backside surface of the wafer 990 using chemical vapor deposition, atomic layer deposition, spin-on film deposition process, or other deposition techniques. The film formation module 924 and the metrology module 923 can be installed on a common platform having an automated wafer handling system that automatically moves the wafer 990 from the metrology module 923 to the film formation module 924.

In an embodiment, the shape control material can include a heat sensitive material, which, when reactive to heat, may have its internal stress modified by the heat to become compressive, neutral or tensile. In another embodiment, the shape control material can include a photosensitive material, which, when exposed to actinic radiation or light, absorbs light in the desired or required energy spectrum and exhibits a chemical/physical reaction that allows applications at different fields.

The treatment modules 923-928 can also include one or more bake modules 925 that are configured to bake the wafer 990 to a target temperature. For example, the bake module 925 can bake and stabilize the wafer 990 at 32° C. or 90° C. As another example, the bake module 925 can bake the wafer 990 with a shape control material (e.g., a heat sensitive material) formed thereon using a pattern of heat that correspond to a bow measurement of the wafer 990, to correct or modify an internal stress of the shape control layer. The treatment modules 923-928 can also include one or more radiation sources 926 that are configured to project onto different regions of the shape control material radiations of variable intensities that correspond to the bow measurement of the wafer 990. The treatment modules 923-928 can also include a plurality of heating units 927, which can be installed on a wafer chuck that is used for a wafer to be placed thereon. The heating units 927 can have an arrangement corresponding to a certain pattern of heat and generate different temperature ranges of heat, and the wafer chuck can thus have a plurality of heating zones that correspond to the certain pattern of heat. Accordingly, the shape control material can be heated in different regions that correspond to the certain pattern of heat and its stresses in the different regions can be modified to become compressive, neutral or tensile.

The wafer processing system 900 further includes a controller 980. The controller 980 can be a computer processor located within the wafer processing system 900, or located remotely but being in communication with components, e.g., the metrology module 923, the film formation module 924, the bake module 925, the radiation source 926 and the heating units 927, of the wafer processing system 900. In an embodiment, the controller 980 is configured to control the metrology module 923 to measure a wafer 990 to identify a bow measurement of the wafer 990, receive the bow measurement from the metrology module 923, control the film formation module 924 to form a shape control layer on the backside (or frontside or both) surface of the wafer 990, control the bake module 925 to differentially bake the wafer 990 with the shape control layer formed thereon using a pattern of heat that corresponds to the bow measurement of the wafer 990, control the radiation source 926 to project on different regions of the shape control layer radiations of variable intensities that correspond to the bow measurement of the wafer 990 and/or control the heating units 927 to generate different temperature ranges of heat that correspond to the a certain pattern of heat, to correct or modify the internal stress of the stressor film. The film formation module 924, the bake module 925 and the controller 980 can be referred to as a wafer processing device. The controller 980 may execute a process for mathematically removing gravity effects from a geometry measurement of the wafer as described herein.

The wafer processing system 900 can also include other stages or components, e.g., a stepper/scanner 930, a singulation device 940 and a bonding tool 950. The singulation device 940 can be configured to dice and singulate a wafer, with or without a shape control layer formed thereon, to obtain a plurality of chiplets. The bonding tool 950 is configured to connect (join) an integrated chiplet (or die or wafer) with a wafer together in one mechanically stable package.

Figure 10:
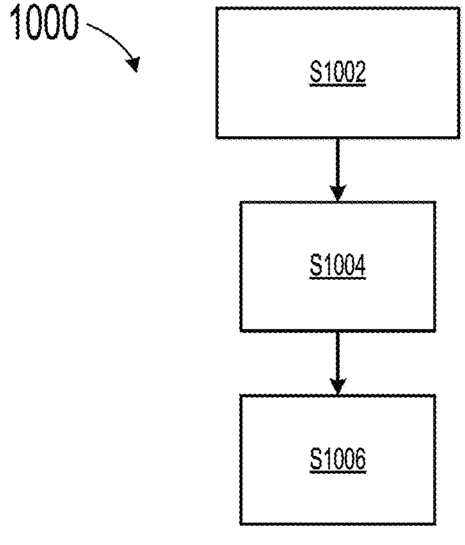
FIG. 10 is a flow diagram of a method for measuring wafer geometry in accordance with an example embodiment of the present disclosure.

FIG. 10 is a flow diagram of a method for measuring wafer geometry in accordance with an example embodiment of the present disclosure. The method 1000 includes s1002 of providing a wafer on a measurement stage. The measurement stage has a wafer contact structure having a predefined configuration for controlling, to some degree, gravity effects at non-contact portions of the wafer as described herein. For example, the wafer may be placed any of the wafer measurement stages 300, 400, 500, 600, 700 or 800 described herein.

At s1004, a metrology tool measures geometry of the wafer resting on the wafer measurement stage. The wafer geometry may be measured by optical, acoustic and/or capacitive techniques. At s1006, gravity effects at non-contact regions of the wafer are mathematically removed from the measured geometry. As the wafer contact structure controls the gravity effects in non-contact portions of the wafer, such gravity effects are predictable to some degree and can be effectively removed from the measurement data such that a true wafer geometry with minimal gravity effects is obtained. In some embodiments, the resulting measurement is used to determine bow or warp of a wafer so that it can be corrected and/or considered in further processing steps performed on the wafer.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a dielectric layer on or overlying a base substrate structure such as a thin film. Thus, substrate is not limited to any particular base structure, underlying dielectric layer or overlying dielectric layer, patterned or un-patterned, but rather, is contemplated to include any such dielectric layer or base structure, and any combination of dielectric layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A wafer measurement stage for supporting a semiconductor wafer for surface geometry measurements, comprising:

a support body having a planar surface configured to face a wafer which is supported by the wafer measurement stage; and a wafer contact structure provided on the planar surface, wherein the wafer contact structure is configured to contact a portion of a wafer such that the wafer is supported in an elevated position relative to the planar surface and to control gravity effects at non-contact portions of the wafer, wherein the wafer contact structure comprises a line of support material which forms a closed shape structure, such as a ring contact structure on the planar surface.

2. The wafer measurement stage of claim 1, wherein the planar surface of the support body has a smaller area than a wafer to be supported on the wafer measurement stage.

3. The wafer measurement stage of claim 1, wherein the contact structure comprises a plurality of said ring contact structures provided in concentric arrangement on the planar surface.

4. The wafer measurement stage of claim 1, wherein the wafer contact structure comprises a plurality of lines of support material provided on the planar surface.

5. The wafer measurement stage of claim 4, wherein the plurality of lines of support material do not intersect one another.

6. The wafer measurement stage of claim 4, wherein the plurality of lines of support material comprise a plurality of parallel lines of support material.

7. The wafer measurement stage of claim 5, wherein the plurality of lines of support material intersect one another.

8. The wafer measurement stage of claim 1, wherein the wafer contact structure comprises silicone.

9. The wafer measurement stage of claim 1, wherein a cross section of the line of support material has a substantially circular shape.

10. The wafer measurement stage of claim 1, wherein a cross section of the line of support material has a substantially rectangular shape having a top support surface and opposing sidewalls which extend from the top support surface to the planar surface of the support body.

11. The wafer measurement stage of claim 1, wherein the wafer contact structure comprises a field of support material covering the planar surface.

12. An apparatus for measuring geometry of a wafer, comprising:

a wafer measurement stage for supporting a semiconductor wafer, the wafer measurement stage comprising:

a support body having a planar surface configured to face a wafer which is supported by the wafer measurement stage, and a wafer contact structure provided on the planar surface, wherein the wafer contact structure is configured to contact a portion of a wafer such that the wafer is supported in an elevated position relative to the planar surface and to control gravity effects at non-contact portions of the wafer, wherein the wafer contact structure comprises a line of support material which forms a closed shape structure, such as a ring contact structure on the planar surface; and a metrology tool configured to measure geometry of a wafer resting on the wafer measurement stage.

13. The apparatus of claim 12, wherein the metrology tool is configured to measure wafer geometry using at least one of optical, acoustic, and capacitive mechanisms to measure the z-height deviations across a surface of the wafer.

14. The apparatus of claim 12, further comprising a processing unit including a processor and a memory for storing software which, when executed by the processor, mathematically removes at least a portion of gravity effects from a measured geometry of a wafer resting on the wafer measurement stage.

15. The apparatus of claim 14, wherein the memory stores data correlated to gravity effects on said non-contact portions of the wafer for use in mathematically removing the gravity effects on said non-contact portions of the wafer resting on the wafer measurement stage.

16. A method of measuring wafer geometry comprising:

providing a wafer on a measurement stage comprising:

a support body having a planar surface configured to face a wafer which is supported by the measurement stage, and a wafer contact structure provided on the planar surface, wherein the wafer contact structure is configured to contact a portion of a wafer such that the wafer is supported in an elevated position relative to the planar surface and to control gravity effects at non-contact portions of the wafer, wherein the wafer contact structure comprises a line of support material which forms a closed shape structure, such as a ring contact structure, on the planar surface; and measuring a geometry of the wafer resting on the wafer measurement stage.

17. The method of claim 16, further comprising mathematically removing gravity effects from a geometry measurement obtained from said measuring a geometry.

18. The method of claim 17, wherein said mathematically removing comprises removing gravity effects on said non-contact portions of the wafer resting on the wafer measurement stage.

* * * * *